United States Patent
Goller et al.

(10) Patent No.: US 6,710,455 B2
(45) Date of Patent: Mar. 23, 2004

(54) ELECTRONIC COMPONENT WITH AT LEAST TWO STACKED SEMICONDUCTOR CHIPS AND METHOD FOR FABRICATING THE ELECTRONIC COMPONENT

(75) Inventors: Bernd Goller, Kemnath (DE); Gerald Ofner, Bad Abbach (DE); Josef Thumbs, Breitenbrunn (DE); Holger Wörner, Regensburg (DE); Robert-Christian Hagen, Sarching (DE); Christian Stümpfl, Schwandorf (DE); Stefan Wein, Regensburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/231,881

(22) Filed: Aug. 30, 2002

(65) Prior Publication Data

US 2003/0047813 A1 Mar. 13, 2003

(30) Foreign Application Priority Data

Aug. 30, 2001 (DE) .......................... 101 42 120

(51) Int. Cl.[7] .......................... H01L 23/48; H01L 23/52; H01L 29/40
(52) U.S. Cl. .......................... 257/777; 257/686; 438/109
(58) Field of Search .................. 257/686, 777, 257/784; 438/107, 108, 109

(56) References Cited

U.S. PATENT DOCUMENTS

| | | | |
|---|---|---|---|
| 6,005,778 A | * | 12/1999 | Spielberger et al. |
| 6,100,594 A | * | 8/2000 | Fukui et al. |
| 6,271,598 B1 | * | 8/2001 | Vindasius et al. |
| 6,333,562 B1 | * | 12/2001 | Lin |
| 6,351,028 B1 | * | 2/2002 | Akram |
| 6,359,340 B1 | * | 3/2002 | Lin et al. |
| 6,441,496 B1 | * | 8/2002 | Chen et al. |
| 6,545,365 B2 | * | 4/2003 | Kondo et al. |
| 6,555,902 B2 | * | 4/2003 | Lo et al. |

FOREIGN PATENT DOCUMENTS

| | | |
|---|---|---|
| JP | 08 250 651 A | 9/1996 |
| JP | 2000 058 743 A | 2/2000 |

* cited by examiner

*Primary Examiner*—Sheila V. Clark
(74) *Attorney, Agent, or Firm*—Laurence A. Greenberg; Werner H. Stemer; Ralph E. Locher

(57) ABSTRACT

An electronic component is formed with at least two semiconductor chips that are disposed on a carrier substrate. Active chip surfaces of the semiconductor chips include central contact surfaces on which opposing solder contact surfaces are formed. These are conductively connected to an intermediate carrier which is disposed between the semiconductor chips and which produces rewirings from them to the carrier substrate. A method for fabricating the component is also described.

15 Claims, 3 Drawing Sheets

ELECTRONIC COMPONENT WITH AT LEAST TWO STACKED SEMICONDUCTOR CHIPS AND METHOD FOR FABRICATING THE ELECTRONIC COMPONENT

BACKGROUND OF THE INVENTION

FIELD OF THE INVENTION

The present invention relates to an electronic component with at least two stacked semiconductor chips and a method for fabricating the same.

In many electronic components, a first semiconductor module, for instance a logic module, and a second semiconductor module, for instance a memory module, are needed. In order to save space on a printed circuit board (PCB), it makes sense to house both semiconductor chip modules in a common housing with an optimally low space requirement. A logic module typically has a square surface, and a memory module has a rectangular surface, so that when semiconductor modules are stacked as in a known chip-on-chip structure, the bond contact surfaces partly overlap. One solution to the problem is to dispose the two semiconductor modules side by side in one housing, which results in a substantial consumption of space. In an alternative solution, the two semiconductor modules are mounted in a lead frame housing, which is associated with a complex and difficult assembly, because the components must be turned several times with bond wires partly exposed. Another principle is also applied, according to which the semiconductor modules are mounted in different housings, which are then stacked. But this is a cost-intensive method, and furthermore, it leads to large mounting heights of the electronic component.

Published, Japanese Patent Application JP 08250651-A describes a semiconductor configuration in which two semiconductor modules are stacked in spaces that are separated by a dividing wall. Both semiconductor chip modules are connected with the aid of bond wires to external contacts by way of interconnects. The known semiconductor configuration takes up a relatively large component volume and is complicated and expensive to fabricate.

SUMMARY OF THE INVENTION

It is accordingly an object of the invention to provide an electronic component with at least two stacked semiconductor chips and a method for fabricating the electronic component which overcome the above-mentioned disadvantages of the prior art devices and methods of this general type, which is easy to build and inexpensive to fabricate, and which takes up a small space.

With the foregoing and other objects in view there is provided, in accordance with the invention, an electronic component. The electronic component contains semiconductor chips including at least one first semiconductor chip and at least one second semiconductor chip. The first semiconductor chip has an active chip surface and a passive back side, and the second semiconductor chip has a passive back side. A stacking layer is disposed between the first semiconductor chip and the second semiconductor chip. A carrier substrate receives the semiconductor chips and has a top side. The passive back side of the first semiconductor chip is fastened to the top side of the carrier substrate. The passive back side of the second semiconductor chip is fastened to the active chip surface of the first semiconductor chip through the stacking layer. First bonding connections are formed for conductively connecting the first semiconductor chip to the top side of the carrier substrate. Second bonding connections are formed for conductively connecting the second semiconductor chip to the top side of the carrier substrate.

The electronic component inventively contains the first semiconductor chip, the second semiconductor chip as well as the carrier substrate for receiving the semiconductor chips.

A first passive back side of the first semiconductor chip is fastened on a top side of the carrier substrate. A second passive back side of the second semiconductor chip is fastened on a first active chip surface of the first semiconductor chip by way of a stacking layer. The first and second semiconductor chips are also conductively connected to the top side of the carrier substrate by first and second bond connections, respectively.

The inventive component has the advantage that two semiconductor modules with different outer dimensions can be housed in a common housing in an extremely space-efficient fashion by reason of the fact that the semiconductor chips are joined to one another.

It is thus possible to stack a square semiconductor chip with a rectangular semiconductor chip and vice versa, whereby the semiconductor chips only partly overlap, and whereby both semiconductor chips include regions protruding beyond the overlap, respectively. No feasible solution can be found in the prior art for such different outer dimensions.

An inventive embodiment provides that the first and second semiconductor chips are conductively connected to contact terminal pads on the top side of the carrier substrate by first and second bond wires. The stacking layer between the two semiconductor chips makes it possible to connect the first semiconductor chip to the carrier substrate with the aid of bond wires before the second semiconductor chip is mounted. The stacking layer has a height that guarantees a minimum spacing between the bond wires and the second semiconductor chip. The advantage of the embodiment is its highly compact construction that is also easy to fabricate.

In an embodiment of the invention, the first semiconductor chip has a first stacking surface on its first active chip surface. The first stacking surface is connected two-dimensionally to a second stacking surface on the second passive back side of the second semiconductor chip by way of the stacking layer. In this embodiment of the invention, it is possible to achieve a precisely defined spatial distribution of the stacked semiconductor chips, and therefore to conductively connect each semiconductor chip to the carrier substrate without the semiconductor chip which is mounted later being able to damage or squeeze the bond wires.

According to a preferred embodiment of the invention, the stacking layer contains an adhesive layer with particles embedded in it. The particles can be formed of ceramic powder and can provide for a defined spacing between the two semiconductor chips, i.e. a defined stacking layer height.

According to an alternative embodiment of the invention, the stacking layer contains an adhesive layer and an adhesive frame surrounding the adhesive layer. The adhesive frame provides for a defined height of the stacking layer and thus a defined spacing of the semiconductor chips from one another.

According to another embodiment of the invention, the carrier substrate is provided with external contacts on a bottom side, which is averted from the semiconductor chips, which contacts can be realized as contact bumps for flip-chip assembly, for example. This makes possible a rapid and cost-effective processing of the electronic component, which can be placed on a PCB and soldered thereto.

According to another development, the carrier substrate is constructed as a rewiring board. A three-dimensional rewiring structure can also be contained in the carrier substrate, as warranted, which gives the inventive electronic component highly compact dimensions.

The advantage of an electronic component that is built and fabricated according to the invention is the ability to reliably conductively connect a memory module with a rectangular shape and a logic module with a square shape in a small space.

A housing that covers the carrier substrate and surrounds the semiconductor chips can be constructed extremely flat and therefore highly compact.

An inventive method for fabricating an electronic component according to one of the foregoing embodiments includes the now described steps. A first semiconductor chip is prepared with a first stacking surface on a first active chip surface. A second semiconductor chip is prepared with a second stacking surface on a second passive back side. A carrier substrate which has at least one bearing surface and contact terminal pads on a top side is also prepared.

The first, passive back side of the first semiconductor chip is fastened to the bearing surface of the carrier substrate using a conductive adhesive layer or a solder layer. First bond connections between first contact surfaces on the first active chip surface of the first semiconductor chip and contact terminal pads on the carrier substrate are produced by first bond wires. The contact terminal pads on the top side of the carrier substrate are conductively connected to external contact surfaces on a bottom side of the carrier substrate.

A stacking layer is then deposited on the first stacking surface on the first active chip surface of the first semiconductor chip, whereupon a second stacking surface on the second passive back side of the second semiconductor chip is placed on the stacking layer. Next, second bond connections between second contact surfaces on the second active chip surface of the second semiconductor chip and contact terminal pads on the carrier substrate are produced by second bond wires, whereupon the electronic component is finally cast in a housing.

The advantage of the method for fabricating the inventive electronic component is that it has very short fabrication times and furthermore yields highly compact components. According to an embodiment of the inventive method, the stacking layer that is deposited on the first semiconductor chip is so high that it protrudes beyond the first bond wires. This guarantees that the first bond wires cannot be touched by a portion of the second semiconductor chip that protrudes beyond the first semiconductor chip.

According to another embodiment of the inventive method, the stacking layer is deposited as an adhesive layer with particles embedded in it, which advantageously allows the height of the stacking layer to be precisely set.

According to an alternative embodiment of the invention, the stacking layer can be constructed as an adhesive layer and as an adhesive frame surrounding this, which is placed on the first semiconductor chip and on which the second semiconductor chip is then placed.

By gluing the memory module on with intervening space (glue height or spacer chip), it is possible to stack the two components and contact the bond pads despite partial overlapping of the bond pads without having to employ a rewiring device. The overall component height can be minimized by setting the glue height or the spacer chip (bond wire height+ safety tolerance) on the logic module. The wire bonding is accomplished like the gluing in two passes, and therefore the wire bonding from chip to chip and from the chip to the substrate can be achieved without a nonstandard technology. The small mounting height is possible by virtue of the fact that the wire bonds of the logic module are situated partly beneath the memory module. The cured adhesive frame serves as a spacer medium, and the filling particles that are potentially incorporated in the adhesive (which are ceramic or the like) serve as a spacer medium.

Other features which are considered as characteristic for the invention are set forth in the appended claims.

Although the invention is illustrated and described herein as embodied in an electronic component with at least two stacked semiconductor chips and a method for fabricating the electronic component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
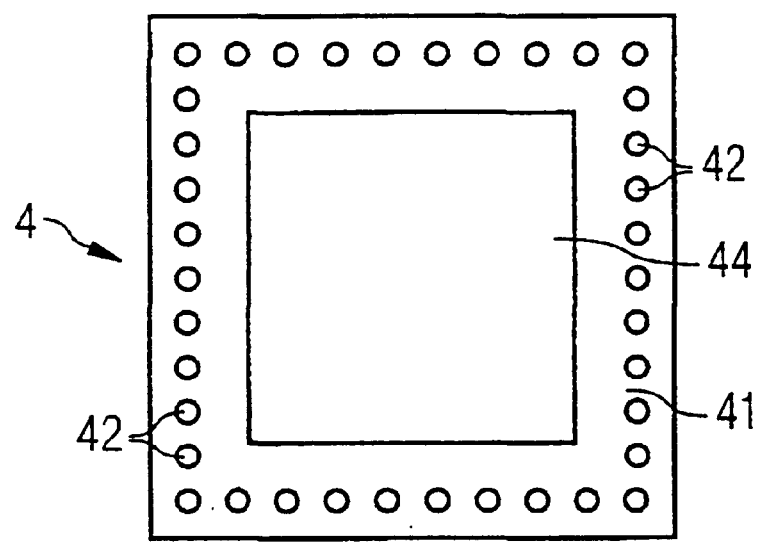
FIG. 1 is a diagrammatic, plan view of a first semiconductor chip according to the invention.

Referring now to the figures of the drawing in detail and first, particularly, to FIG. 1 thereof, there is shown a schematic plan view of a first semiconductor chip 4, which is provided with several first contact surfaces 42 and a first stacking surface 44 on a first active chip surface 41. The first semiconductor chip 4 has a square base surface. The first contact surfaces 42 are provided in respective edge regions of the first active chip surface 41. A smaller region is remote from the outer edge and forms the first stacking surface 44.

Figure 2:
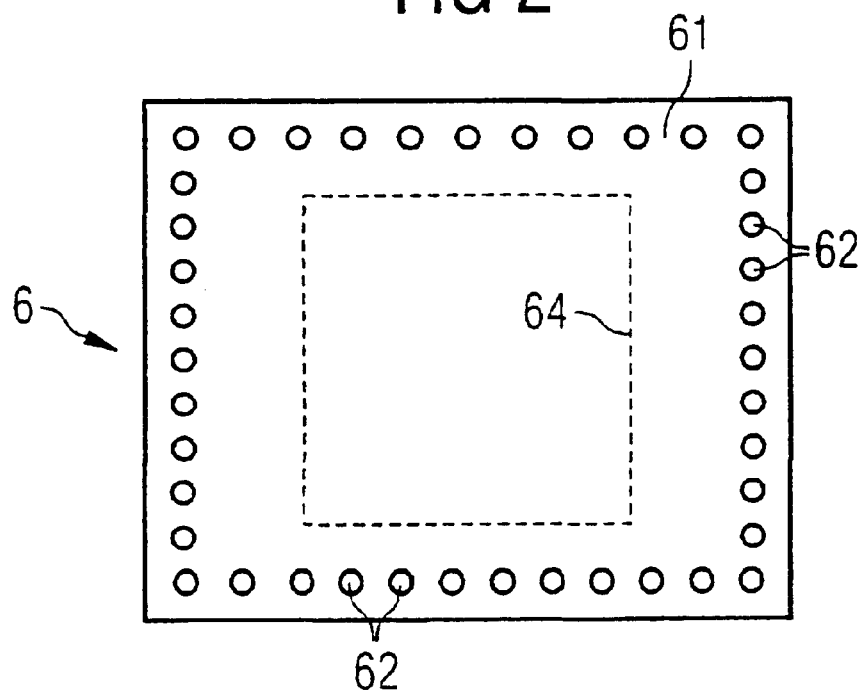
FIG. 2 is a diagrammatic, plan view of a second semiconductor chip according to the invention.

FIG. 2 represents a schematic plan view of a second semiconductor chip 6, which is likewise provided with contact surfaces 62 at edge sides of a second active chip surface 61. The second semiconductor chip 6 contains a region on a second passive back side 63 which is smaller than the passive back side. This area, which is indicated by the dashed lined rectangle, forms a second stacking surface 64. The first stacking surface 44 and the second stacking surface 64 are advantageously disposed centrally on the first active chip surface 41 and the second passive back side 63, respectively, and advantageously have equal dimensions, so that they can be congruently positioned on top of one another.

Figure 3:
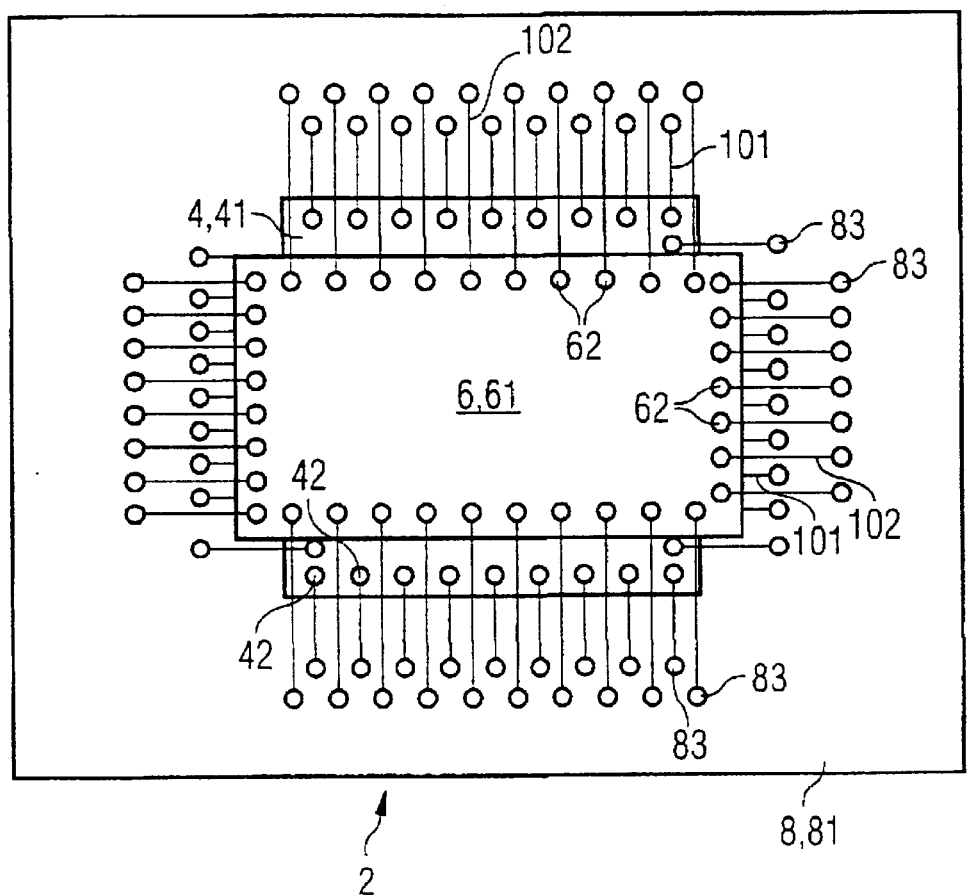
FIG. 3 is a diagrammatic, plan view of an electronic component according to the invention.

FIG. 3 is a schematic plan view showing an inventive electronic component 2 containing the first semiconductor chip 4, the second semiconductor chip 6, and a carrier substrate 8. The first semiconductor chip 4, and over this the second semiconductor 6 chip, are installed on the flat carrier substrate 8 centrally. A top side 81 of the carrier substrate 8, the first active chip surface 41, and the second active chip surface 61 thus point toward the viewer. A plurality of first bond wires 101 lead from the first contact surfaces 42 of the first semiconductor chip 4 to contact terminal pads 83 on the top side 81 of the carrier substrate 8. A plurality of second bond wires 102 lead from the second contact surfaces 62 of the second semiconductor chip 6 to contact terminal pads 83 on the carrier substrate 8.

Figure 4:
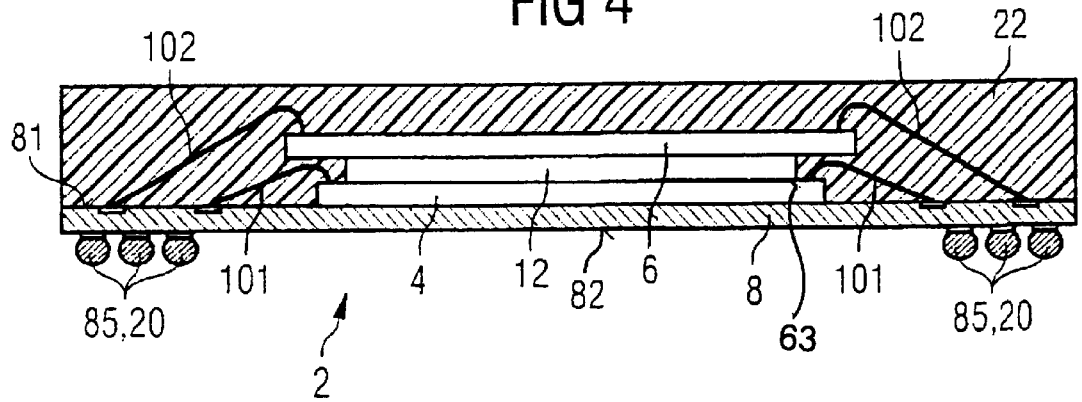
FIG. 4 is a sectional view of the electronic component.

FIG. 4 is a schematic side view of the electronic component 2. The semiconductor chips 4, 6 can be seen, which are separated from one another by a stacking layer 12. Also recognizable are external contacts 85 on a bottom side 82 of the flat carrier substrate 8, which are constructed as contact bumps (e.g. solder balls) in the exemplifying embodiment. It can also be seen that the second semiconductor chip 6 protrudes beyond the first semiconductor chip 4 in edge regions as represented in this view, and that spacing is provided from the first bond wires 101 to the second passive back side 63 of the second semiconductor chip 6. The two semiconductor chips 4, 6 and the top side 81 of the carrier substrate 8 are covered by a housing 22, for instance a plastic housing that is fabricated by transfer molding or injection molding.

Figure 5:
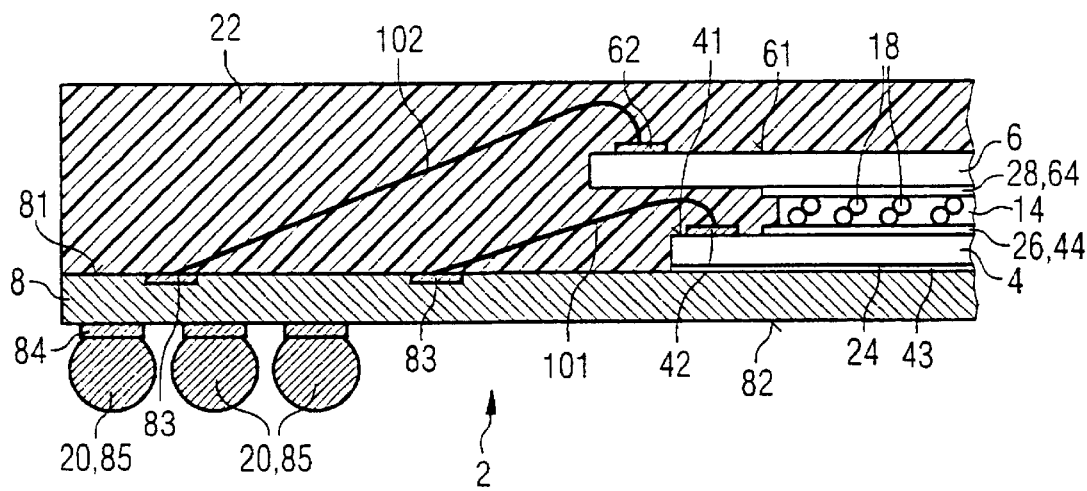
FIG. 5 is a detailed sectional view of the electronic component.

FIG. 5 represents a detailed section of the electronic component 2 wherein the stacking layer 12 is constructed as an adhesive layer 14 with particles 18 embedded in it. The particles 18 can be formed of ceramic powder and provide in this case for a defined spacing between the two semiconductor chips 4, 6, given that the particles 18 respectively abut second and third bonding layers 26, 28 which are deposited on the first stacking surface 44 and the second stacking surface 64.

The first passive back side 43 of the first semiconductor chip 4 is fastened onto the top side 81 of the carrier substrate 8. A first bonding layer 24, for instance a layer formed of epoxy resin that covers the entire back side of the chip 4, is provided for forming a joint. The first stacking surface 44 on the first active chip surface 41 of the first semiconductor chip 4 is covered with the second bonding layer 26, also an epoxy resin layer, for instance. The second stacking surface 64 on the second passive back side 63 of the second semiconductor chip 6 is covered by the third bonding layer 28, which can also contains an epoxy resin. Located between the first and second stacking surfaces 44, 64, namely between the second and third bonding layers 26, 28, is the adhesive layer 14 with the substantially uniformly distributed embedded particles 18.

Figure 6:
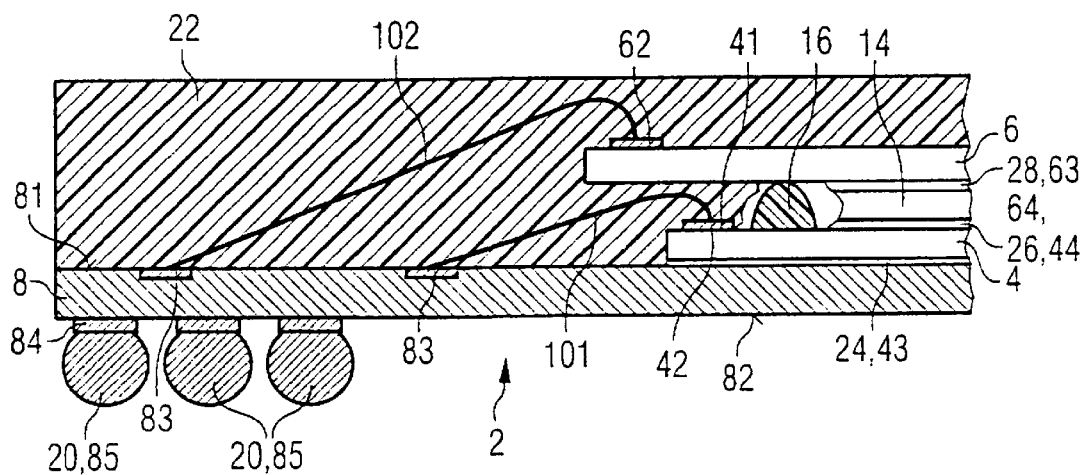
FIG. 6 is a detailed sectional view of the electronic component in an alternative embodiment of the invention.

FIG. 6 represents a detailed section of the electronic component in an alternative embodiment of the invention wherein the stacking layer 12 is constructed as an adhesive layer 14 and an adhesive frame 16 surrounding the adhesive layer 14. The adhesive frame 16, on which the second semiconductor chip 6 can be placed in the hardened condition, forms the defined spacing between the two semiconductor chips 4, 6.

The adhesive frame 16 advantageously forms the outer edge of the first and second stacking surfaces 44, 64.

As is clearly represented in FIGS. 4 to 6, the first bond wires 101, which lead from the first contact surfaces 42 to contact terminal pads 83, are at a slight distance from the second passive back side 63 of the second semiconductor chip 6. The second bond wires 102 extend in arcs parallel to the first bond wires 101 from the second contact surfaces 62 to contact terminal pads 83 situated farther outside.

The top side 81 of the carrier substrate 8 and thus the semiconductor chips 4, 6 and the bond wires 101, 102 are covered by a housing 22 made of plastic.

The bottom side 82 of the carrier substrate 8 contains a plurality of external contact surfaces 84, which are conductively connected to the contact terminal pads 83. The carrier substrate 8 can be constructed as a rewiring board with a three-dimensional rewiring structure. External contacts 85, here contact bumps 20 (solder balls), are installed on the external contact surfaces 84.

An inventive method for fabricating the electronic component 2 will now be described in connection with FIGS. 1 to 6.

The first semiconductor chip 4 is prepared with the first stacking surface 44 on the first active chip surface 41 (FIG. 1). The second semiconductor chip 6 is then prepared with the second stacking surface 64 on the second passive back side 61 (FIG. 2). Both semiconductor chips are provided with contact surfaces on their active sides.

The first passive back side 43 of the first semiconductor chip 4, which can be a logic module with a square outer contour, for example, is fastened onto a bearing surface on the top side 81 of the flat carrier substrate 8.

The fastening is achieved by way of the first bonding layer 24, for instance a layer of conductive glue or epoxy or a solder layer.

Next, first bond connections are produced between the first contact surfaces 42 on the first active chip surface 41 of the first semiconductor chip 4 and the contact terminal pads 83 on the carrier substrate 8 by the first bond wires 101. In the second bonding layer 26, for instance an epoxy resin layer, which covers the first stacking surface 44, the stacking layer 12 is installed, whose height is such that it reliably projects beyond the first bond wires 101. The stacking layer 12 can be filled with embedded particles 18 (FIG. 5), or as a substantially homogenous adhesive layer 14 with an adhesive frame 16 surrounding it (FIG. 6).

The second stacking surface 64 of the second semiconductor chip 6 is placed on the stacking layer 12. This is located on the second passive back side 63. An additional, third adhesive layer 28 of epoxy resin or the like can be provided in between.

The second semiconductor chip 6, which protrudes at least partly beyond the first semiconductor chip 4, has a rectangular outer contour and can be a memory module.

Second bond connections are produced by the second bond wires 102 between the second contact surfaces 62 on the second active chip surface 61 of the second semiconductor chip 6 and additional one of the contact terminal pads 83 on the top side 81 of the carrier substrate 8.

Lastly, the electronic component is cast in the housing 22 which covers at least the top side 81 of the carrier substrate 8 as well as the semiconductor chips 4, 6 and the bond wires 101, 102.

We claim:

1. An electronic component, comprising:
   semiconductor chips including at least one first semiconductor chip and at least one second semiconductor chip, said first semiconductor chip having a first active chip surface with a first stacking surface thereon, and a first passive back side, said second semiconductor chip having a second passive back side with a second stacking surface thereon, said first semiconductor chip having a different geometric shape than said second semiconductor chip, one of said semiconductor chips having a square shape and another of said semiconductor chips having a rectangular shape;

a stacking layer disposed between said first semiconductor chip and said second semiconductor chip, said first stacking surface being arealy connected with said second stacking surface through said stacking layer;

a carrier substrate for receiving said semiconductor chips and having a top side, said first passive back side of said first semiconductor chip fastened to said top side of said carrier substrate, said first and second semiconductor chips only partially overlapping in a region and each semiconductor chip having a region extending out of the overlapping region;

first bonding connections for conductively connecting said first semiconductor chip to said top side of said carrier substrate; and second bonding connections for conductively connecting said second semiconductor chip to said top side of said carrier substrate.

2. The electronic component according to claim 1, further comprising contact terminal pads disposed on said top side of said carrier substrate, said first bonding connections include first bonding wires conductively connecting said first semiconductor chip to said contact terminal pads, and said second bonding connections include second bond wires conductively connecting said second semiconductor chip to further ones of said contact pads.

3. The electronic component according to claim 1, wherein said stacking layer contains an adhesive layer and particles embedded in said adhesive layer.

4. The electronic component according to claim 3, wherein said particles have a defined size and effectuate a defined thickness of said stacking layer.

5. The electronic component according to claim 1, wherein said stacking layer contains an adhesive layer and an adhesive frame surrounding said adhesive layer.

6. The electronic component according to claim 5, wherein said adhesive frame has a defined height and effectuates a defined thickness of said stacking layer.

7. The electronic component according to claim 1,
wherein said carrier substrate has a bottom side averted from said semiconductor chips; and
further comprising external contact surfaces and external contacts disposed on said bottom side.

8. The electronic component according to claim 1, wherein said carrier substrate is a rewiring board.

9. The electronic component according to claim 1, wherein said first semiconductor chip has a square shape and is a logic module.

10. The electronic component according to claim 1, wherein said second semiconductor chip has a rectangular shape and is a memory module.

11. The electronic component according to claim 1, further comprising a housing covering said first and second semiconductor chips.

12. A method for fabricating an electronic component, which comprises the steps of:

providing a first semiconductor chip having a first passive back side and a first active chip surface with a first stacking surface on the first active chip surface;

providing a second semiconductor chip having a second active chip surface and a second passive back side with a second stacking surface on the second passive back side;

providing the first semiconductor chip with a different geometric shape than the second semiconductor chip, one of the semiconductor chips having a square shape and another of the semiconductor chips having a rectangular shape;

providing a carrier substrate having at least one bearing surface and contact terminal pads on a top side;

fastening the first passive back side of the first semiconductor chip onto the bearing surface of the carrier substrate with one of a conductive adhesive layer and a solder layer;

producing first bond connections by connecting first bond wires between first contact surfaces on the first active chip surface of the first semiconductor chip and the contact terminal pads on the carrier substrate;

depositing a stacking layer on the first stacking surface on the active chip surface of the first semiconductor chip;

placing the second stacking surface of the second semiconductor chip on the stacking layer;

areally connecting the first stacking surface with the second stacking surface through the stacking layer causing the first and second semiconductor chips to only partially overlap in a region and each semiconductor chip having a region extending out of the overlapping region;

producing second bond connections by connecting second bonding wires between contact surfaces on the second active chip surface of the second semiconductor chip and the contact terminal pads on the carrier substrate; and potting the semiconductor chips and the carrier substrate in a housing.

13. The method according to claim 12, which comprises depositing the stacking layer with a height protruding beyond the first bond wires.

14. The method according to claim 12, which comprises depositing an adhesive layer with particles embedded in the adhesive layer as the stacking layer.

15. The method according to claim 12, which comprises depositing an adhesive layer and an adhesive frame surrounding the adhesive layer as the stacking layer.

* * * * *